(12) United States Patent
Honda et al.

(10) Patent No.: US 9,893,490 B2
(45) Date of Patent: Feb. 13, 2018

(54) LASER POWER-SUPPLY DEVICE THAT CONTROLS A PLURALITY OF LIGHT-EMITTING ELEMENTS

(71) Applicant: FANUC CORPORATION, Yamanashi (JP)

(72) Inventors: Masahiro Honda, Yamanashi (JP); Shuuji Kudou, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/367,673

(22) Filed: Dec. 2, 2016

(65) Prior Publication Data

US 2017/0163006 A1 Jun. 8, 2017

(30) Foreign Application Priority Data

Dec. 4, 2015 (JP) ................................. 2015-237457

(51) Int. Cl.
*H05B 33/08* (2006.01)
*H02M 1/00* (2006.01)
(Continued)

(52) U.S. Cl.
CPC ............ *H01S 5/042* (2013.01); *F21V 29/508* (2015.01); *H01S 5/02446* (2013.01);
(Continued)

(58) Field of Classification Search
None
See application file for complete search history.

(56) References Cited

U.S. PATENT DOCUMENTS 7,566,142 B2 * 7/2009 Wesson ............... H01L 25/0753
315/297
8,742,685 B1 * 6/2014 Nalbant ............. H05B 33/0827
315/291

(Continued)

FOREIGN PATENT DOCUMENTS

JP 2012222322 A 11/2012
JP 2013-475562 A 9/2013

(Continued)

OTHER PUBLICATIONS

Notification of Reasons for Refusal for Japanese Application No. 2015-237457, dated Oct. 3, 2017, including English translation, 4 pages.

*Primary Examiner* — Dedei K Hammond
(74) *Attorney, Agent, or Firm* — RatnerPrestia

(57) ABSTRACT

A laser power-supply device including a power-supply unit including a voltage input unit into which an AC voltage is inputted, a rectifier circuit, and a plurality of sub-switching regulator units, and a light-emitting unit, in which the plurality of sub-switching regulator units is connected in parallel to output of the rectifier circuit, the light-emitting unit includes a plurality of sub-light-emitting units, each of the sub-light-emitting units includes one light-emitting element row, a current is supplied to the one light-emitting element row from each of the plurality of sub-switching regulator units, and each of the sub-switching regulator units includes a switching circuit, a smoothing circuit, a current detection circuit that detects an output current, and a control circuit that controls the switching circuit on the basis of a current command value and the detected output current.

7 Claims, 4 Drawing Sheets

(51) Int. Cl.

| | | |
|---|---|---|
| *H02M 7/217* | (2006.01) | |
| *H01S 5/042* | (2006.01) | |
| *F21V 29/508* | (2015.01) | |
| *H01S 5/024* | (2006.01) | |
| *H02J 3/14* | (2006.01) | |
| *H01S 5/40* | (2006.01) | |

(52) U.S. Cl.
CPC .............. *H01S 5/4025* (2013.01); *H02J 3/14* (2013.01); *H05B 33/0815* (2013.01)

(56) References Cited

U.S. PATENT DOCUMENTS

| | | | | |
|---|---|---|---|---|
| 2007/0210722 | A1* | 9/2007 | Konno | H05B 33/0803 |
| | | | | 315/185 S |
| 2007/0297175 | A1* | 12/2007 | Glent-Madsen | G02B 26/04 |
| | | | | 362/282 |
| 2010/0213856 | A1* | 8/2010 | Mizusako | H02M 1/36 |
| | | | | 315/158 |
| 2012/0206427 | A1 | 8/2012 | Yamamuro et al. | |
| 2012/0268021 | A1* | 10/2012 | Lee | H05B 33/0827 |
| | | | | 315/192 |

FOREIGN PATENT DOCUMENTS

| | | |
|---|---|---|
| JP | 2014-232692 A | 12/2014 |
| WO | 2011052418 A1 | 5/2011 |

\* cited by examiner

LASER POWER-SUPPLY DEVICE THAT CONTROLS A PLURALITY OF LIGHT-EMITTING ELEMENTS

BACKGROUND OF THE INVENTION

1. Field of the Invention

The present invention relates to a laser power-supply device, and in particular, relates to a laser power-supply device that is inexpensive and little-affected by breakage.

2. Description of the Related Art

A laser power-supply device has a light-emitting unit (cavity unit) that supplies excitation light to a laser oscillator, and a power-supply unit for supplying a current to the cavity unit and controlling light emission of a plurality of light-emitting elements. The cavity unit generally has a plurality of light-emitting elements. As a circuit configuration of the power-supply unit, a switching regulator composed of a rectifier circuit, a switching circuit, a smoothing circuit, a current detection circuit, and a control circuit is known. Circuit components of the switching regulator are mounted on a printed circuit board, the printed circuit board is surrounded by a housing frame, and repair and replacement at the time of manufacture or breakage of the laser power-supply device are performed for each of the power-supply unit. In the laser power-supply device, after a voltage (for example, AC 200 V) to be supplied to a voltage input unit of the power-supply unit is rectified by the rectifier circuit, the voltage is converted to a DC voltage by the switching circuit and the smoothing circuit, a current is supplied to the plurality of light-emitting elements of the cavity unit, and a current value thereof is detected by the current detection circuit. The current value is feedback-controlled to be constant with respect to a current command value from a current command unit.

Generally, in a light-emitting element such as an LED or a semiconductor laser, light intensity (light power) to be outputted varies in accordance with a current. Since characteristics of a voltage between terminals (forward voltage) Vf of a light-emitting element vary in accordance with environmental factors such as a production tolerance and a temperature, the light power is controlled by controlling the current supplied to the cavity unit from the power-supply unit.

When an AC input voltage in the power-supply unit is A, and a forward voltage of the light-emitting element is Vf, the number N of the light-emitting elements that can be connected in series in the cavity unit needs to satisfy $A \times 2^{1/2} \geq Vf \times N$. Thus, in order to increase the number of the light-emitting elements so as to obtain desired light power, the light-emitting elements need to be connected in parallel. Generally, failure of a light-emitting element is due to a short circuit. Thus, in this configuration, there was a problem in that the operation of the device is stopped when any one of the light-emitting elements is broken (short-circuits).

Japanese Unexamined Patent Publication (Kokai) No. 2013-175562 describes a laser power-supply device having a main circuit that supplies a principal current for laser output to a lamp, and a simmer circuit that supplies a simmer current, and a configuration in which a switching loss is reduced, and a printed circuit board is not broken even when a semiconductor element fails. Japanese Unexamined Patent Publication (Kokai) No. 2013-175562 does not describe a plurality of light-emitting element rows, and the simmer circuit described in Japanese Unexamined Patent Publication (Kokai) No. 2013-175562 is a circuit fundamentally different from the main circuit.

Japanese Unexamined Patent Publication (Kokai) No. 2014-232692 describes a technique in which switching regulators are configured in series in two stages in a control device including an electronic transformer for a low-voltage halogen lamp such that the control device stably behaves even when a luminaire for turning on a light-emitting element is connected thereto. Japanese Unexamined Patent Publication (Kokai) No. 2014-232692 does not describe a plurality of light-emitting element rows.

It is desired that, in a laser power-supply device, the number of light-emitting elements to be mounted can be easily increased, and the device can continue to operate even when any one of the light-emitting elements is broken (short-circuits).

SUMMARY OF INVENTION

It is an object of the invention to achieve a laser power-supply device in which the number of light-emitting elements to be mounted can be increased at low cost, and which is little-affected by breakage of a light-emitting element.

In a laser power-supply device according to the present invention, a plurality of sub-switching regulators are connected in parallel with respect to a rectifier circuit, and one light-emitting element row is connected in series to an output unit of each of the plurality of sub-switching regulators.

In other words, a laser power-supply device includes a power-supply unit having a voltage input unit into which an AC voltage is inputted, a rectifier circuit that rectifies the AC voltage, and a plurality of sub-switching regulator units, and a light-emitting unit, in which the plurality of sub-switching regulator units is connected in parallel to output of the rectifier circuit, the light-emitting unit has a plurality of sub-light-emitting units, each of the sub-light-emitting units has one light-emitting element row in which a plurality of light-emitting elements is connected in series, a current is supplied to the one light-emitting element row from each of the plurality of sub-switching regulator units, and each of the sub-switching regulator units has a switching circuit, a smoothing circuit, a current detection circuit that detects an output current, and a control circuit that controls the switching circuit on the basis of a current command value and the detected output current.

The voltage input unit, the rectifier circuit, and the plurality of sub-switching regulator units of the power-supply unit are mounted on the same power-supply printed circuit board.

The power-supply unit has a power-supply cooling plate that cools power elements of the rectifier circuit and the plurality of sub-switching regulator units in common.

The power-supply printed circuit board and the power-supply cooling plate are housed in a power-supply housing frame.

The light-emitting elements of the plurality of sub-light-emitting units of the light-emitting unit are directly mounted on the same light-emitting unit cooling plate.

The light-emitting unit cooling plate is housed in a light-emitting unit housing frame.

The power-supply unit further has a current command value input unit in which the current command values to the plurality of sub-switching regulator units are inputted into the current command value input unit, and the current command values to the plurality of sub-switching regulator units are inputted into the current command value input unit respectively or in time division through common terminals.

BRIEF DESCRIPTION OF THE DRAWINGS

The present invention will be understood more clearly by referring to the following accompanying drawings.

DETAILED DESCRIPTION

A laser power-supply device that controls a plurality of light-emitting elements will be described with reference to the drawings. It should be understood that the invention is not limited to the drawings or embodiments described below.

A laser power-supply device of a conventional example will be described before describing the exemplary embodiments of the present invention.

Figure 4:
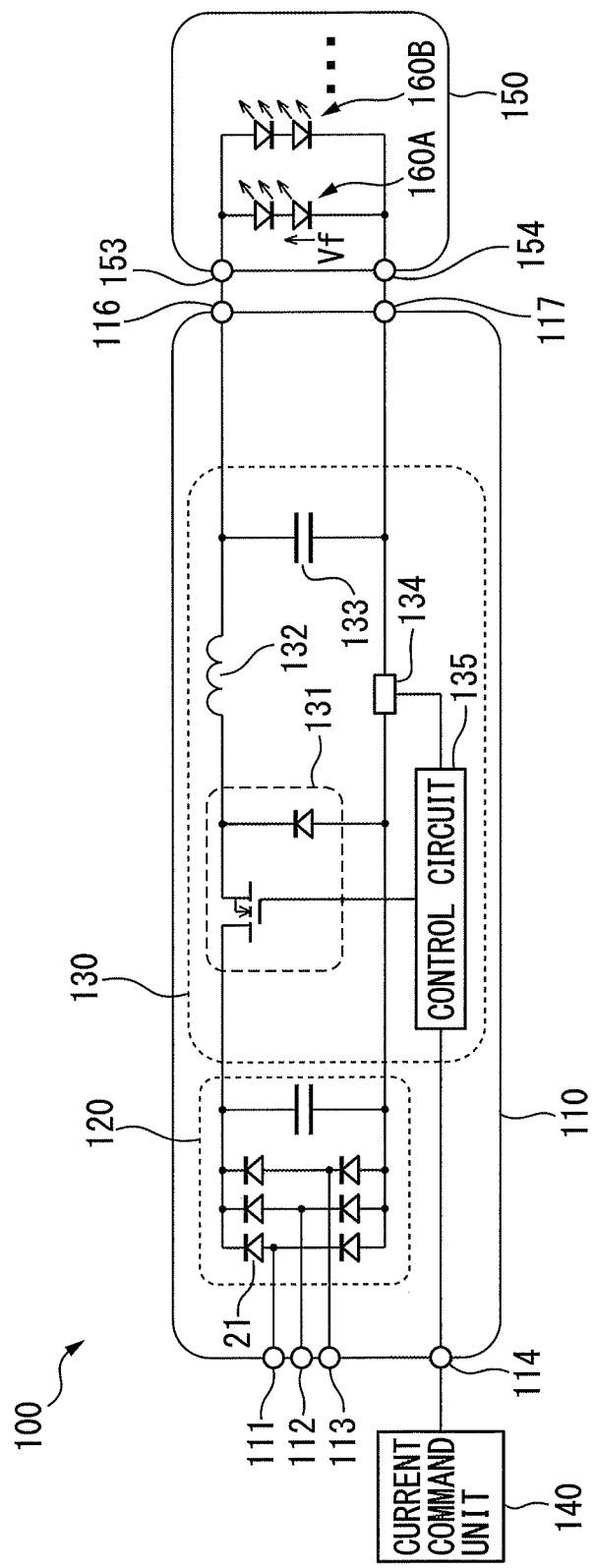
FIG. 4 is a diagram illustrating a configuration of a general laser power-supply device of a conventional example.

FIG. 4 is a diagram illustrating a configuration example of a conventional and general laser power-supply device.

A general laser power-supply device 100 has a power-supply unit 110 and a light-emitting (cavity) unit 150.

The power-supply unit 110 has a voltage input unit including terminals 111 to 113 into which a three-phase AC current is inputted, a current command value input unit including an input terminal 114 of a current command value from an outside current command unit 140, a rectifier circuit 120 that rectifies the three-phase AC current, a switching regulator unit 130, and a DC output unit having terminals 116 and 117 from which a DC current is outputted. The rectifier circuit 120 illustrated in the drawing has six diodes and a capacitative element. The switching regulator unit 130 has a switching circuit 131, an inductance element (coil) 132, a capacitative element 133, a current detection circuit 134, and a control circuit 135. The switching circuit 131 has a switching transistor and a diode. The switching transistor turns on and off in accordance with a control signal from the control circuit 135, and generates a charge current in cooperation with the diode. A smoothing circuit composed of the inductance element 132 and the capacitative element 133 generates a DC voltage between both ends of the capacitative element 133 from the charge current. The capacitative element 133 outputs a DC current from the terminals 116 and 117. The current detection circuit 134 detects a current value of the outputted DC current, and the control circuit 135 generates the control signal of the switching transistor on the basis of the detected current value and the current command value. The rectifier circuit 120 and the switching regulator unit 130 are widely-known circuits, and further description is omitted.

The cavity unit 150 has terminals 153 and 154 connected to the terminals 116 and 117 of the power-supply unit 110 via cables, and one or more light-emitting element rows 160A, 160B, . . . connected between the terminals 153 and 154. When the plurality of light-emitting element rows 160A, 160B, . . . is connected, the light-emitting element rows 160A, 160B, . . . are connected in parallel. The cavity unit 150 has semiconductor lasers or LEDs as the light-emitting elements, and excites a laser oscillator with light generated by the semiconductor lasers or the LEDs.

In a light-emitting element such as an LED or a semiconductor laser, light intensity (light power) to be outputted varies in accordance with a current. Since a voltage between terminals (forward voltage) Vf of a light-emitting element varies in accordance with environmental factors such as a production tolerance and a temperature, the light power is controlled by controlling the DC current value supplied to the cavity unit from the power-supply unit 110.

In the switching regulator unit 130, the control circuit 135 generates the control signal of the switching transistor on the basis of the current value detected by the current detection circuit 134 and the current command value inputted from the current command value input unit. The control signal is a signal that turns on and off the transistor, and the DC current value is determined in accordance with a ratio of an on period in a predetermined cycle length (duty ratio). Therefore, the control circuit 135 generates the control signal whose duty ratio is adjusted so that the DC current value in accordance with the current command value can be obtained. Although the input terminal 114 of the current command value is indicated by one line in FIG. 4, it is assumed that there are terminals according to the number of bits indicating the current command value. In addition, when the command from the current command unit is an analog signal, the generation of the control signal can be realized even when there are two terminals (standard and peak value). The same is true of the following description.

Circuit components of the power-supply unit 110 are mounted on a printed circuit board, and the printed circuit board is housed in a housing frame. In addition, the light-emitting elements in the cavity unit 150 are mounted on a cooling plate, and the cooling plate is housed in the housing frame. Repair and replacement at the time of manufacture or breakage are performed for each of the power-supply unit and the cavity unit.

When an AC input voltage in the power-supply unit is A, and a forward voltage of the light-emitting element is Vf, the number N of the light-emitting elements that can be connected in series in the cavity unit needs to satisfy $A \times 2^{1/2} \geq Vf \times N$. Thus, when increasing the number of the light-emitting elements so as to increase the light power outputted by the cavity unit, it was general that the number of the light-emitting element rows connected in parallel between the terminals 153 and 154 is increased, or the number of pairs of the power-supply unit and the cavity unit is increased without increasing the number of the light-emitting element rows connected in parallel. It is also conceivable that the numbers of the power-supply units and the cavity units to be housed in the housing frame are increased.

The above-described two methods have the advantage that a circuit configuration and a control method of the power supply are simple. However, in the method of increasing the number of the light-emitting element rows connected in parallel, there is a problem that light emission cannot be performed at all if even one of all of the connected light-emitting elements is broken, and there is a problem that the light-emitting elements are at significant risk of breakage. The reason why light emission cannot be performed at all is that breakage of a light-emitting element generally causes a short circuit state. Thus, an excess current flows in the power-supply unit, and the laser power-supply device performs an alarm stop. In such a state, the operation is difficult, and outage time until the state where the operation can be restarted (downtime) is long.

In addition, the method of increasing the number of pairs of the power-supply unit and the cavity unit contains a problem that the cost of the device is increased. In the method of increasing the numbers of the power-supply units and the cavity units to be housed in the housing frame, although the frame is not increased in number, other components are all increased in number. Accordingly, there was a problem that the cost of the device is also increased and manufacturing and handling as a maintenance unit is difficult because the unit is increased in size.

In the laser power-supply device of the exemplary embodiments to be described below, the number of light-emitting elements to be mounted can be increased at low cost, and the influence of breakage of a light-emitting element can be reduced.

Figure 1:
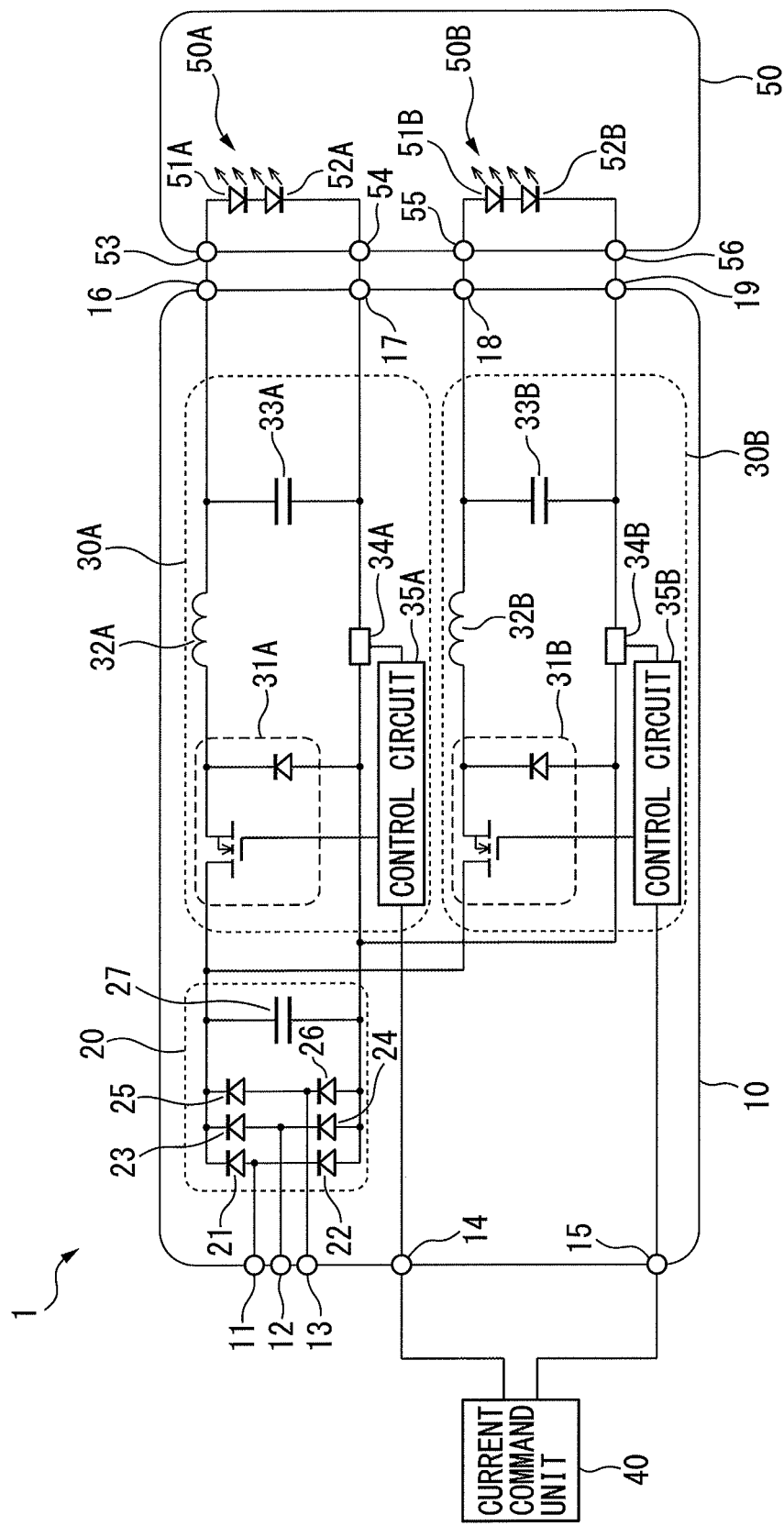
FIG. 1 is a diagram illustrating a configuration of a laser power-supply device of a first exemplary embodiment.

FIG. 1 is a diagram illustrating a configuration of a laser power-supply device of a first exemplary embodiment.

A laser power-supply device 1 of the first exemplary embodiment has a power-supply unit 10 and a light-emitting (cavity) unit 50. The power-supply unit 10 has a voltage input unit including terminals 11 to 13, a current command value input unit including input terminals 14 and 15 of current command values from an outside current command unit 40, a rectifier circuit 20, a first sub-switching regulator unit 30A, a second sub-switching regulator unit 30B, a first DC output unit having terminals 16 and 17, and a second DC output unit having terminals 18 and 19. The rectifier circuit 20 has six diodes 21 to 26 and a capacitative element 27. The two diodes 21 and 22, the two diodes 23 and 24, and the two diodes 25 and 26 are respectively connected in series to form three diode rows, and the three diode rows are connected in parallel between a high-voltage line and a low-voltage line. Connection nodes of the diodes of the respective rows are connected to the terminals 11 to 13, respectively. The capacitative element 27 is connected in parallel between the high-voltage line and the low-voltage line. The foregoing rectifier circuit 20 is widely-known, and thus further description is omitted.

The first sub-switching regulator unit 30A and the second sub-switching regulator unit 30B have the same configurations as that of the switching regulator unit 30 of FIG. 4, and are connected in parallel to the output of the rectifier circuit 20. The output of the first sub-switching regulator unit 30A is connected to the terminals 16 and 17 of the first DC output unit, and the output of the second sub-switching regulator unit 30B is connected to the terminals 18 and 19 of the second DC output unit. A control circuit 35A of the first sub-switching regulator unit 30A generates a control signal of a transistor of a switching circuit 31A on the basis of a current command value inputted from the terminal 14 of the current command value input unit and an output current value detected by a current detection circuit 34A. A control circuit 35B of the second sub-switching regulator unit 30B generates a control signal of a transistor of a switching circuit 31B on the basis of a current command value inputted from the terminal 15 of the current command value input unit and an output current value detected by a current detection circuit 34B. The configuration and the behavior of a switching regulator are widely-known, and thus detailed description is omitted.

The cavity unit 50 has terminals 53 and 54 connected to the terminals 16 and 17 of the power-supply unit 10 via cables, terminals 55 and 56 connected to the terminals 18 and 19 of the power-supply unit 10 via cables, one light-emitting element row 50A connected between the terminals 53 and 54, and one light-emitting element row 50B connected between the terminals 55 and 56. In this example, the light-emitting element row 50A has two light-emitting elements 51A and 52A which are connected in series, and the light-emitting element row 50B has two light-emitting elements 51B and 52B which are connected in series. Here, the light-emitting element rows 50A and 50B are sometimes referred to as sub-light-emitting (cavity) units.

Figure 2:
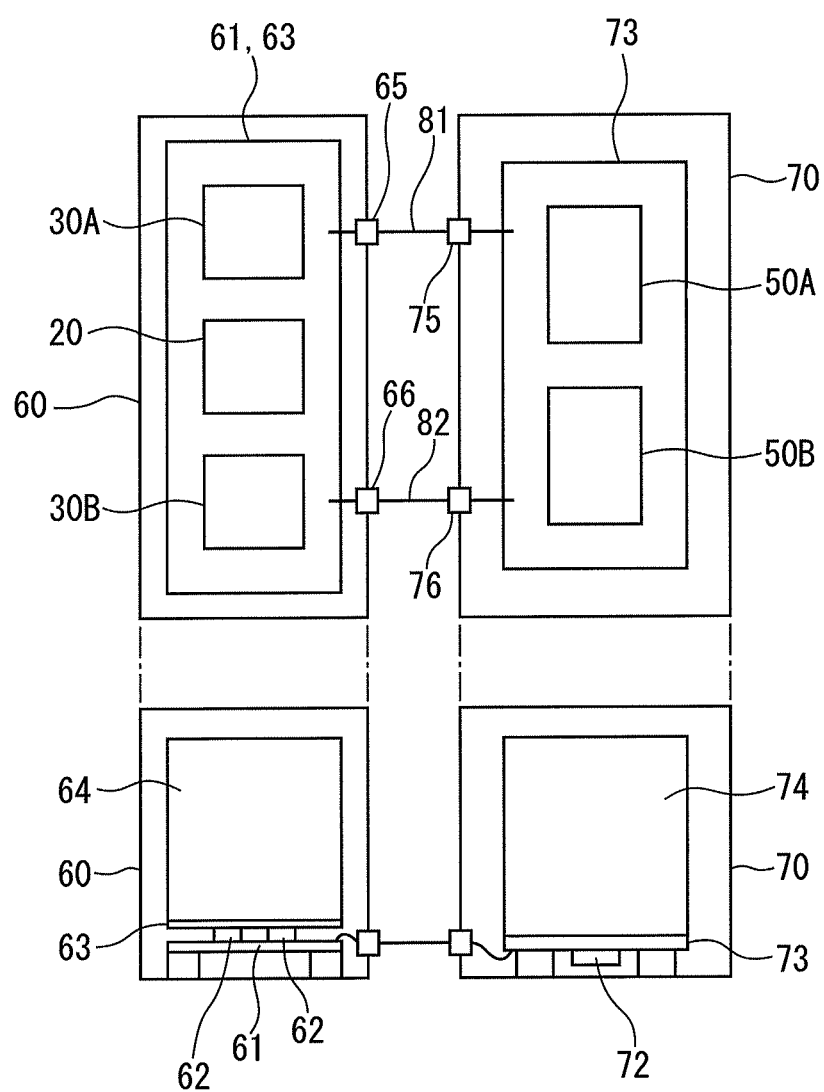
FIG. 2 is a diagram illustrating a configuration example of a housing frame of the laser power-supply device of the first exemplary embodiment.

FIG. 2 is a top view and a front view illustrating a configuration of a housing frame of the laser power-supply device of the first exemplary embodiment, and for simplicity's sake, the top view is illustrated with an upper frame being omitted, and the front view is illustrated with a front frame being omitted.

A housing frame 60 for a power-supply unit has a printed circuit board 61 on which circuit components are mounted, a cooling plate 63, and a cooling mechanism 64 for cooling the cooling plate 63. Circuit components that configure the rectifier circuit 20, the first sub-switching regulator unit 30A, and the second sub-switching regulator unit 30B of FIG. 1 are mounted on the printed circuit board 61 as illustrated in the drawing. Power elements 62 such as diodes and transistors among the circuit components that configure the rectifier circuit 20, the first sub-switching regulator unit 30A, and the second sub-switching regulator unit 30B are arranged such that upper surfaces thereof are in contact with the cooling plate 63. The printed circuit board 61, the cooling plate 63, and the cooling mechanism 64 are used in common by the rectifier circuit 20, the first sub-switching regulator unit 30A, and the second sub-switching regulator unit 30B.

Output DC current terminals 65 and 66 are provided on the housing frame 60 for a power-supply unit, the output DC current terminal 65 is connected to the terminals 16 and 17 via cables or the like, and the output DC current terminal 66 is connected to the terminals 18 and 19 via cables or the like. Each of the output DC current terminals 65 and 66 is illustrated as one terminal in the drawing, but has two electrode terminals. In addition, the output DC current terminals 65 and 66 can be combined into one terminal having four poles. The housing frame 60 for a power-supply unit has terminals for a three-phase AC power supply, which are connected to the terminals 11 to 13, and terminals connected to the terminals 14 and 15 of the current command value input unit, but these terminals are not illustrated in the drawing.

A housing frame 70 for a cavity unit has a cooling plate 73 on which the light-emitting elements are mounted, and a cooling mechanism 74 for cooling the cooling plate 73. The light-emitting elements that configure the light-emitting element rows 50A and 50B of FIG. 1 are mounted on the cooling plate 73 as illustrated in the drawing. The light-emitting elements 51A, 52A, 51B, and 52B that configure the light-emitting element rows 50A and 50B are power elements, and are represented as power elements 72 in FIG. 2. The power elements 72 are mounted on the cooling plate 73, and are directly cooled. The cooling plate 73 and the cooling mechanism 74 are used in common by the light-emitting element rows 50A and 50B.

Input DC current terminals 75 and 76 are provided on the housing frame 70 for a cavity unit, the input DC current terminal 75 is connected to the terminals 53 and 54 via cables or the like, and the input DC current terminal 76 is connected to the terminals 55 and 56 via cables or the like. Each of the input DC current terminals 75 and 76 is illustrated as one terminal in the drawing, but has two electrode terminals. In addition, the input DC current terminals 75 and 76 can be combined into one terminal having four poles. Furthermore, the output DC current terminals 65 and 66 of the housing frame 60 for a power-supply unit are connected to the input DC current terminals 75 and 76 of the housing frame 70 for a cavity unit via cables 81 and 82.

As described above, in the laser power-supply device of the first exemplary embodiment, the two sub-switching regulator units 30A and 30B are connected in common to the one rectifier circuit 20, and the two sub-switching regulator units 30A and 30B respectively control DC currents to be supplied to the two light-emitting element rows 50A and 50B of the cavity unit 50 on the basis of the current command values. Although the example in which the two sub-switching regulator units 30A and 30B are provided has been described here, three or more sub-switching regulator units may be provided, three or more light-emitting element rows may be provided in the cavity unit 50, and one rectifier circuit is used in common also in this case.

Therefore, in the laser power-supply device of the first exemplary embodiment, in the power-supply unit 10, the housing frame 60, the rectifier circuit 20, the printed circuit board 61, and the cooling plate 63 (the cooling mechanism 64) are used in common, and the device can be configured at lower cost compared to when the number of power-supply units is simply increased as in the conventional example. Similarly, also in the cavity unit 50, the housing frame 70 and the cooling plate 73 (the cooling mechanism 74) are used in common, and the device can be configured at lower cost.

Only one light-emitting element row is connected to the DC output unit of each of the sub-switching regulator units, and can be driven even when a light-emitting element of another light-emitting element row is broken. In other words, the plurality of light-emitting element rows in the cavity unit 50 is independent with one another, and breakage has no influence on one another. Thus, risk caused during breakage of a light-emitting element can be reduced, and the operation can be continued by exciting a laser oscillator with light generated by an unbroken light-emitting element row.

Furthermore, each of the sub-switching regulator units drives only one light-emitting element row, feedback control can be performed such that a current corresponding to the current command value is supplied, and a current flowing in each of the light-emitting element rows can be individually controlled on the basis of the current command value. Accordingly, controllability in low output of a laser oscillator can be improved.

Figure 3:
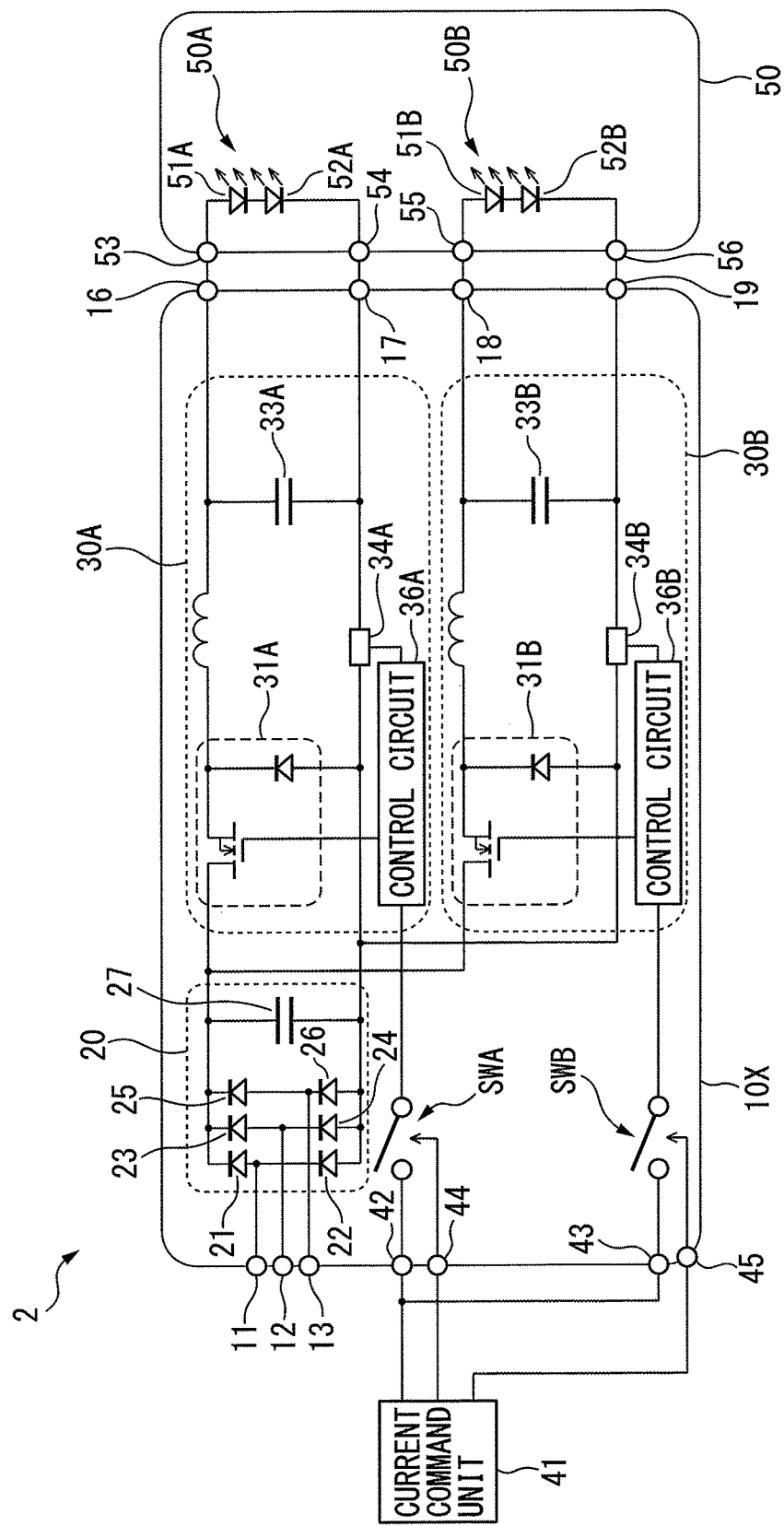
FIG. 3 is a diagram illustrating a configuration of a laser power-supply device of a second exemplary embodiment.

FIG. 3 is a diagram illustrating a configuration of a laser power-supply device of a second exemplary embodiment.

A laser power-supply device 2 of the second exemplary embodiment differs from the laser power-supply device 1 of the first exemplary embodiment in that a power-supply unit 10X has input terminals 42 and 43 of current command values from an outside current command unit 41 in place of the input terminals 14 and 15, a switch SWA is provided in a pathway of the current command value from the input terminal 42 to a control circuit 36A, a switch SWB is provided in a pathway of the current command value from the input terminal 43 to a control circuit 36B, and terminals 44 and 45 into which switching signals of the switches SWA and SWB are inputted from the current command unit 41 are provided, and other parts are the same with each other.

The current command unit 41 outputs the current command values to a common signal line in time division in synchronization with the switching signals of the switches SWA and SWB. When the current command value is outputted to the first sub-switching regulator unit 30A, the switching signal for connecting the switch SWA and shutting down the switch SWB is outputted, and then, the current command value is outputted. Accordingly, the control circuit 36A of the first sub-switching regulator unit 30A receives and stores in an internal memory (register) the current command value, and then, generates a control signal on the basis of the current command value and the detected current value. When the current command value is outputted to the second sub-switching regulator unit 30B, the switching signal for shutting down the switch SWA and connecting the switch SWB is outputted, and then, the current command value is outputted. Accordingly, the control circuit 36B of the second sub-switching regulator unit 30B receives and stores in an internal memory (register) the current command value, and then, generates a control signal on the basis of the current command value and the detected current value. Control sequences of the control circuits 36A and 36B are the same as those of the control circuits 35A and 35B of the first exemplary embodiment except the receiving processing of the current command values.

The laser power-supply device of the second exemplary embodiment has the same advantages as those of the first exemplary embodiment.

Heretofore, the laser power-supply devices of the first and second exemplary embodiments have been described, but it goes without saying that various modified examples can be made.

Other known configurations may be used for the configurations of the rectifier circuit 20, and the first and second sub-switching regulator units 30A and 30B.

Furthermore, the number of the light-emitting elements connected in series to a light-emitting element row in the cavity unit 50 is preferably determined by DC voltages outputted by the first and second sub-switching regulator units 30A and 30B.

According to the present invention, when a light-emitting element is broken, the device can be operated by an unbroken sub-light-emitting unit, and the device can be configured at lower cost compared to when the number of the units is simply increased. Furthermore, the control circuit of each of the sub-switching regulator units is individually controlled by the current command value, and thus, controllability of low output is improved.

What is claimed is:

1. A laser power-supply device comprising:
    a light-emitting unit; and
    a power-supply unit including a voltage input unit into which an AC voltage is inputted, a rectifier circuit that rectifies the AC voltage, and a plurality of sub-switching regulator units; and
    wherein:
        the plurality of sub-switching regulator units are connected in parallel to an output of the rectifier circuit, and connected to separate respective outputs of a current command unit,
        the light-emitting unit includes a plurality of sub-light-emitting units,
        each of the sub-light-emitting units includes one light-emitting element row in which a plurality of light-emitting elements is connected in series, a current being supplied to the one light-emitting element row from each of the plurality of sub-switching regulator units, and
        each of the sub-switching regulator units includes a switching circuit, a smoothing circuit, a current detection circuit that detects an output current, and a control circuit that controls the switching circuit on the basis of a respective current command value received from the output of the current command unit, and a respective detected output current detected by the current detection unit.

2. The laser power-supply device according to claim 1, wherein
the voltage input unit, the rectifier circuit, and the plurality of sub-switching regulator units of the power-supply unit are mounted on the same power-supply printed circuit board.

3. The laser power-supply device according to claim 2, wherein
the power-supply unit includes a power-supply cooling plate that cools power elements of the rectifier circuit and the plurality of sub-switching regulator units in common, and the power-supply printed circuit board and the power-supply cooling plate are housed in a power-supply housing frame.

4. The laser power-supply device according to claim 1, wherein
the light-emitting unit includes a light-emitting unit cooling plate that cools the light-emitting elements of the plurality of sub-light-emitting units in common, and the light-emitting unit cooling plate is housed in a light-emitting unit housing frame.

5. The laser power-supply device according to claim 1, wherein
the power-supply unit further includes a current command value input unit in which the current command values to the plurality of sub-switching regulator units are inputted into the current command value input unit.

6. The laser power-supply device according to claim 5, wherein
the current command values to the plurality of sub-switching regulator units are inputted into the current command value input unit respectively.

7. The laser power-supply device according to claim 5, wherein
the current command values to the plurality of sub-switching regulator units are inputted to the current command value input unit in time division through common terminals.

* * * * *